United States Patent [19]
Ma

[11] Patent Number: 6,163,516
[45] Date of Patent: *Dec. 19, 2000

[54] OPTICAL DISC REPRODUCTION APPARATUS AND METHOD CAPABLE OF CORRECTING A CHARACTERISTIC OF AN EQUALIZER

[75] Inventor: Byung-In Ma, Suwon, Rep. of Korea

[73] Assignee: Samsung Electronics Co., Ltd., Suwon, Rep. of Korea

[*] Notice: This patent issued on a continued prosecution application filed under 37 CFR 1.53(d), and is subject to the twenty year patent term provisions of 35 U.S.C. 154(a)(2).

[21] Appl. No.: 08/944,563

[22] Filed: Oct. 6, 1997

[30] Foreign Application Priority Data

Oct. 4, 1996 [KR] Rep. of Korea ........................ 96-44008

[51] Int. Cl.$^7$ ............................................. G11B 7/00
[52] U.S. Cl. .................................. 369/59; 369/54; 369/58
[58] Field of Search ................................. 399/59, 58, 54, 399/47, 49, 124

[56] References Cited

U.S. PATENT DOCUMENTS

| | | | |
|---|---|---|---|
| 5,323,373 | 6/1994 | Horimai | 369/110 |
| 5,528,574 | 6/1996 | Takeuchi et al. | 369/50 |
| 5,596,559 | 1/1997 | Hiramatsu | 369/54 |
| 5,612,933 | 3/1997 | Iso et al. | 369/53 |
| 5,675,569 | 10/1997 | Yamaguchi et al. | 369/59 |
| 5,699,343 | 12/1997 | Moritsugu et al. | 369/47 |
| 5,719,847 | 2/1998 | Takeishi et al. | 369/54 |
| 5,729,517 | 3/1998 | Fujiwara et al. | 369/59 |
| 5,745,469 | 4/1998 | Kim et al. | 369/124 |
| 5,764,608 | 6/1998 | Satomura | 369/59 |
| 5,790,482 | 8/1998 | Saga et al. | 369/48 |
| 5,848,037 | 12/1998 | Iwasaaki et al. | 369/58 |
| 5,875,164 | 2/1999 | Yamakawa et al. | 369/57 |
| 6,009,067 | 12/1999 | Hayashi | 369/47 |

*Primary Examiner*—Nabil Hindi
*Attorney, Agent, or Firm*—Staas & Halsey LLP

[57] ABSTRACT

A disc reproduction apparatus and method to reproduce an optical disc using a constant linear velocity (CLV) method. The disc reproduction apparatus includes an equalizer to receive a signal read from the optical disc and equalizing the received signal according to an equalization control signal, and a wide-capture range phase-locked loop (wide PLL) to perform a phase lock operation with regard to the received equalized signal based on a phase lock control signal. An automatic adjuster selects one of predetermined phase lock control value, according to a type of an optical disc to be used and reproduction velocity determined during initial operation, and a desired target position to read the data from the optical disc, and generates a phase lock control signal having the selected value. A correction unit selects one of a predetermined first equalization control value and a second equalization control value which is generated by the wide PLL and relates to a phase lock operation, according to the desired target position, and generates an equalization control signal having the selected equalization control value. Accordingly, the disc reproduction apparatus optimizes the characteristics of the equalizer, in the case of reproducing data from a compact disc (CD), a digital video disc (DVD), etc., at various reproduction velocities, using a constant linear velocity method and a wide-capture range phase-locked loop.

34 Claims, 5 Drawing Sheets

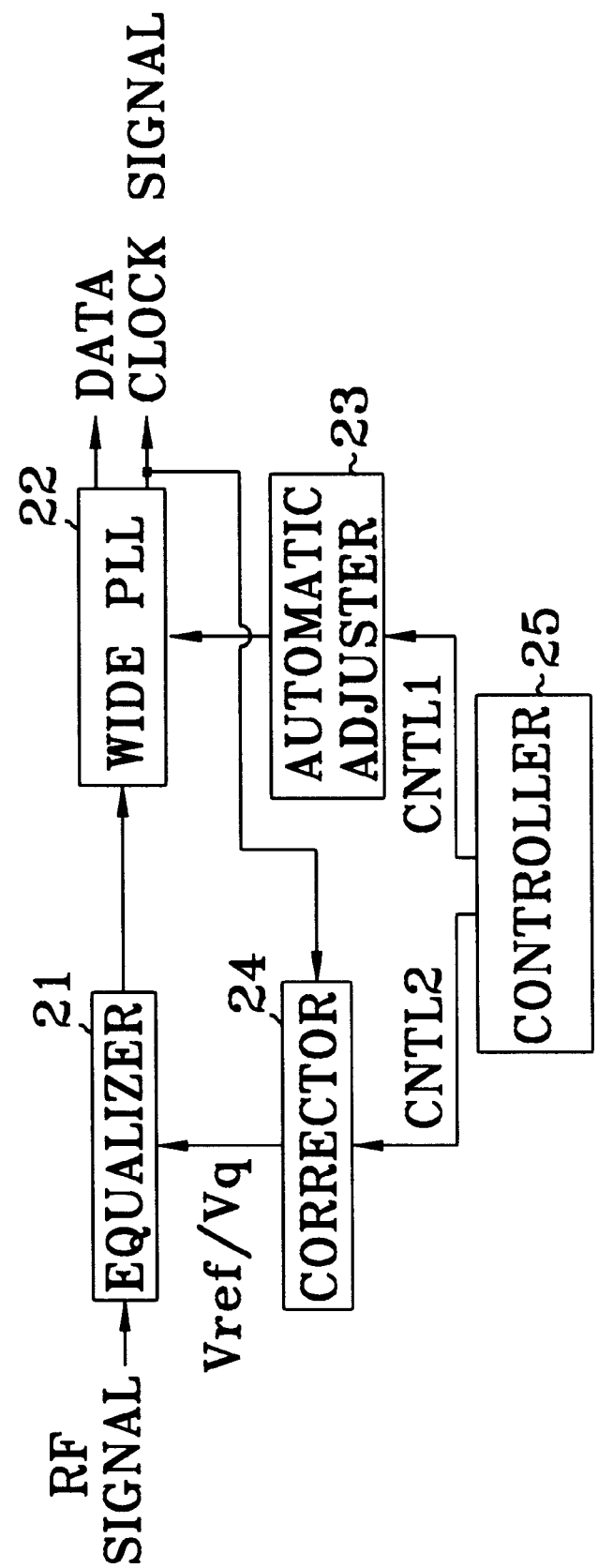

OPTICAL DISC REPRODUCTION APPARATUS AND METHOD CAPABLE OF CORRECTING A CHARACTERISTIC OF AN EQUALIZER

BACKGROUND OF THE INVENTION

1. Field of the Invention

The present invention relates to an optical disc reproduction apparatus and method, and more particularly, to an optical disc reproduction apparatus and method for correcting a signal equalization characteristic of an equalizer using an output of a phase locked loop.

Since an optical disc such as a compact disc (CD) or a digital video disc (DVD) has the merits of a large capacity of recording data owing to a high density of the recording data as compared with a conventional magnetic recording medium, and a relatively fast access time, the optical disc is variously employed in multimedia products or their applications. However, such an optical disc has a considerably slow operation speed, as compared with a hard disk drive or a semiconductor memory to be used as a peripheral device of a personal computer (PC). Accordingly, a variety of methods for obtaining an access time required when an optical disc is used as a peripheral device of the computer have been attempted.

2. Description of the Related Art

In a constant linear velocity (CLV) reproduction method used for heightening a density of recording data on the optical disc, the rotational amount of an optical disc required when data to be read is positioned in the innermost circumference of the optical disc is increased by a factor of two, in comparison with the case when data to be read is positioned in the outermost circumference thereof. However, it takes a much longer time to vary the rotational amount of an optical disc so that the disc has a rotational amount appropriate for reading out data from a target position, rather than to move the pick-up to the target position of the disc. Thus, to reduce the time required for variation of the rotational amount of the disc a method of reducing an access time is used.

As a method for reducing the time required for variation of the rotational amount of the disc, a method for enhancing performance of a spindle motor has been considered. But there is a drawback that an optical disc reproduction apparatus increases in cost. Another method used is a wide-capture range phase-locked loop (hereinafter, refereed as a "wide PLL") for allowing data to be obtained within several tens of % (or above) of a desired rotational amount. A radio frequency (RF) signal which is a high frequency signal read from the optical disc is modulated to serve as self-clock recovery. Therefore, if a PLL which is used to convert the signal read from the optical disc into a binary signal has a broad clock recovery range, data reproduction can be done without converging the rotational amount of the disc to a normal velocity. Accordingly, use of the wide PLL provides a fast access time. The performance of the wide PLL determines a range capable of variable velocity reproduction.

Meanwhile, in the optical disc reproduction apparatus, there is an optical transfer function determined by a wave length of a laser beam, a numerical aperture (NA) of an objective lens, the minimum length of a pit, etc., and an allowable range of reproduction velocity is limited by the optical transfer function. A reproduced signal involves deterioration of the signal. An equalizer is used for correcting the deterioration of the signal. Since a CD relatively stabilizes against the limitation of reproduction velocity by the optical transfer function and the deterioration of the signal, an equalizer is not necessarily required for speed reproduction. However, when a CD is reproduced at a high speed to heighten a transmission rate of data, performance is improved by use of the equalizer. In the case of a DVD, the equalizer is necessarily required.

FIG. 1A shows part of a signal reproducer of a conventional optical disc reproduction apparatus. The apparatus of FIG. 1A comprises a wide PLL 12 and an equalizer 11 having a fixed characteristic value optimized for a constant linear velocity reproduction. FIG. 1B shows a linear velocity and jitter characteristic of the equalizer 11 which is designed to be optimized for constant linear velocity reproduction. When reproducing a CD at a constant linear velocity, the equalizer 11 having the fixed characteristic value can generate a signal deteriorated by the wide PLL 12, but the equalizer 11 can be used without any correction of its characteristic because the degree of deterioration due to the wide PLL 12 is minor. However, it is not possible to obtain the optimized equalization characteristic in variable velocity reproduction due to the fixed characteristic value of the equalizer 11. When the wide PLL 12 is used for reproducing the DVD, the limitation of reproduction velocity and deterioration of a signal occur, and thus the characteristic of the equalizer should be necessarily corrected.

SUMMARY OF THE INVENTION

Therefore, it is an object of the present invention to provide an optical disc reproduction apparatus for correcting a characteristic of an equalizer to prevent a reproduction signal from being deteriorated, using a wide-capture range phase-locked loop and an equalizer.

Additional objects and advantages of the invention will be set forth in part in the description which follows and, in part, will be obvious from the description, or may be learned by practice of the invention.

To accomplish the above and other objects of the present invention, there is provided an optical disc reproduction apparatus for reproducing an optical disc using a constant linear velocity method, the optical disc reproduction apparatus including an equalizer for receiving a signal read from the optical disc, and equalizing the received signal according to an equalization control signal; a wide-capture range phase-locked loop (wide PLL) for receiving the signal equalized by the equalizer, and performing a phase lock operation with regard to the received equalized signal based on a phase lock control signal; an automatic adjuster for selecting one of predetermined phase lock control values, according to a type of an optical disc to be used and reproduction velocity determined during initial operation, and a desired target position to read data from the optical disc, and generating a phase lock control signal having the selected value; and a correction unit for selecting one of a predetermined first equalization control value and a second equalization control value which is generated by the wide PLL and relates to a phase lock operation, according to the desired target position, and generating an equalization control signal having the selected equalization control value.

BRIEF DESCRIPTION OF THE DRAWINGS

These and other objects and advantages of the invention will become apparent and more readily appreciated from the following description of the preferred embodiments, taken in conjunction with the accompanying drawings of which:

FIG. 2 is a block diagram illustrating a signal reproduction unit in an optical disc reproduction apparatus according to a first embodiment of the present invention;

DESCRIPTION OF THE PREFERRED EMBODIMENTS

Figure 1A:
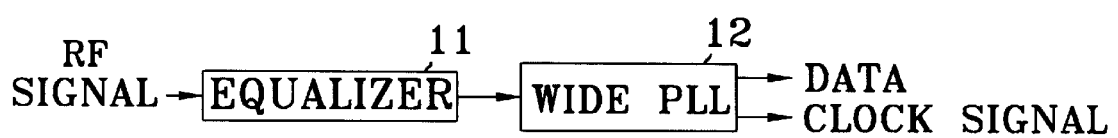
FIG. 1A is a block diagram showing part of a signal reproduction unit of a general optical disc system.
Figure 1B:
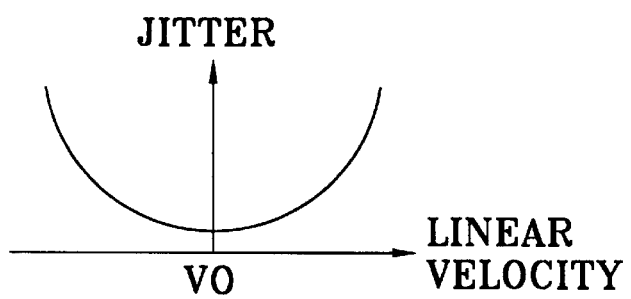
FIG. 1B is a graph showing a relationship between linear velocity and jitter of the general optical disc system shown in FIG. 1A.

Reference will now made in detail to the present preferred embodiments of the present invention, examples of which are illustrated in the accompanying drawings, wherein like reference numerals refer to the like elements throughout. The embodiments are described below to explain the present invention by referring to the figures.

The preferred embodiments of the present invention will be described with reference to the accompanying drawings.

FIG. 2 illustrates part of a signal reproduction unit in an optical disc reproduction apparatus according to a first embodiment of the present invention. A radio frequency signal which is a high frequency signal read from an optical disc (not shown) is input to an equalizer 21. The equalizer 21 equalizes the radio frequency signal according to a characteristic of signal equalization determined by a voltage of an equalization control signal supplied from a corrector 24. A wide-capture range phase-locked loop 22 receives the signal equalized by the equalizer 21 and a phase lock control signal supplied from an automatic adjuster 23, and uses the received signals to generate a clock signal and data. The corrector 24 receives the clock signal generated by the wide PLL 22, and supplies an equalization control signal having one of a predetermined reference voltage Vref and a voltage obtained from the received clock signal, to the equalizer 21. A controller 25, connected to the automatic adjuster 23 and the corrector 24, controls operation of the various blocks.

Figure 3:
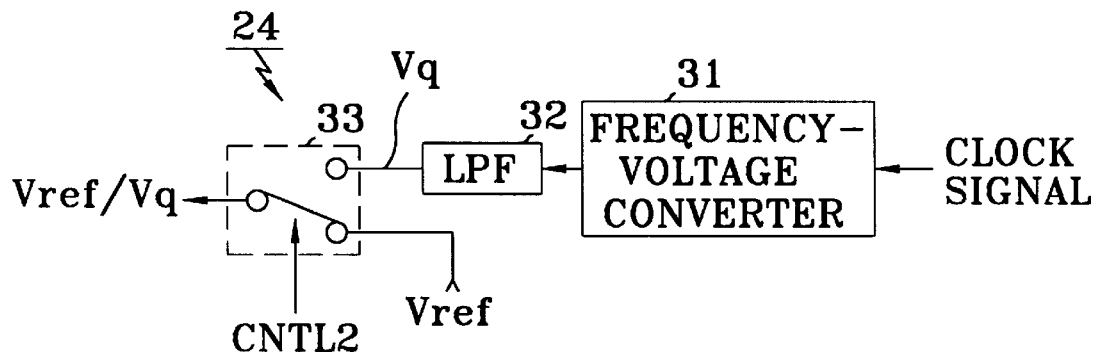
FIG. 3 is a detailed block diagram illustrating a corrector shown in FIG. 2.

The corrector 24, of which a detailed construction is shown in FIG. 3, includes a frequency-voltage converter 31 which receives the clock signal from the wide PLL 22 and performs a frequency-voltage conversion operation with regard to a frequency of the received clock signal. The frequency-voltage converter 31 is connected to a low pass filter 32 for low-pass-filtering the frequency-voltage converted signal. A switch 33 selects one of the output of the low pass filter 32 and the predetermined reference voltage Vref according to a control signal CNTL2 supplied from the controller 25. The selected signal is transmitted to the equalizer 21.

Figure 4:
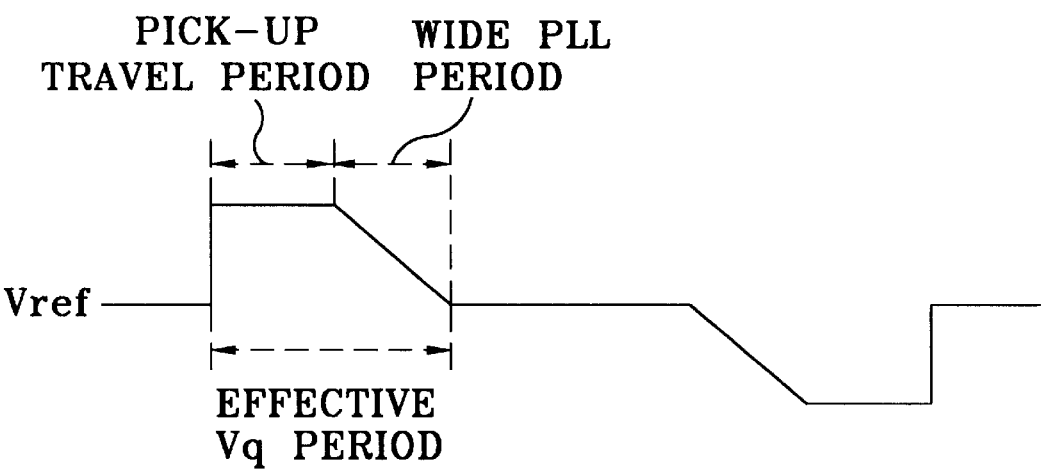
FIG. 4 is an output waveform of the corrector shown in FIG. 2.
Figure 5:
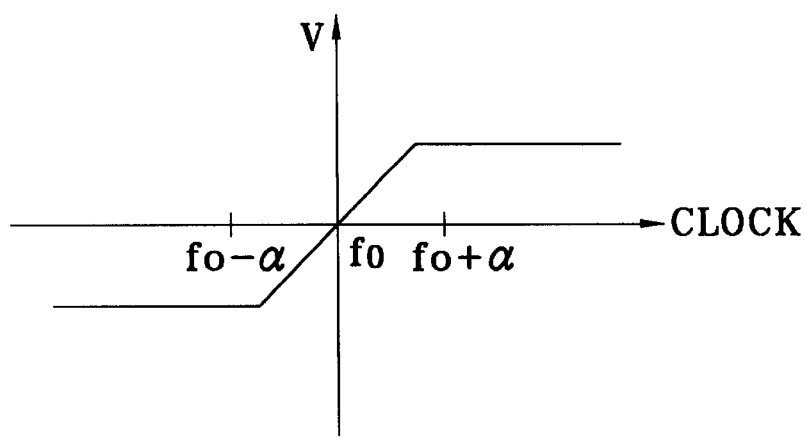
FIG. 5 is a graph showing a characteristic of the corrector shown in FIG. 2.

When the apparatus shown in FIG. 2 starts its operation, the switch 33 in the corrector 24 selects the predetermined reference voltage Vref as shown in FIG. 4, and the selected reference voltage Vref is provided as an equalization control signal to the equalizer 21.

Next, the controller 25 generates a first control signal CNTL1 relating to a target position for reading data from an optical disc (not shown), a type of an optical disc and reproduction velocity, and a second control signal CNTL2 for allowing the corrector 24 to select the signal supplied from the low pass filter 32. The automatic adjuster 23 selects one of predetermined phase lock control values according to the first control signal CNTL1 supplied from the controller 25, and supplies a phase lock control signal having the selected phase lock control value to the wide PLL 22. That is, the automatic adjuster 23 supplies the phase lock control signal to the wide PLL 22 so that an oscillating frequency is the same as an estimated frequency which is appropriate for a target position, a type of an optical disc to be used and reproduction velocity. The wide PLL 22 receives the output signal from the equalizer 21 and the phase lock control signal supplied from the automatic adjuster 23, and uses the received signals to perform an operation for generation of a clock signal and data detection. The clock signal generated by the wide PLL 22 is supplied to the corrector 24.

Referring to FIG. 3, the frequency-voltage converter 31 in the corrector 24 converts the clock signal supplied from the wide PLL 22 so that a frequency of the clock signal is expressed as a voltage, and supplies the converted signal to the low pass filter 32. The low pass filter 32 is used to prevent a voltage of the signal output from the frequency-voltage converter 31 from being severely varied due to any factors. Such a characteristic value of the low pass filter 32, that is passband, is preset as a value considered by an external impact imposed on an optical disc or an amount of jitter varied due to variation of linear velocity, etc., for which a band of approximately 20~30 Hz is appropriate. The signal having a voltage regulated by the low pass filter 32 is transmitted to the switch 33. The switch 33, responsive to the second control signal CNTL2 generated by the controller 25, selects the low-pass-filtered signal supplied from the low pass filter 32 and outputs the selected signal as an equalization control signal to the equalizer 21. The equalizer 21 equalizes the radio frequency signal read from the optical disc, according to a signal equalization characteristic determined on the basis of the voltage Vq of the equalization control signal output supplied from the corrector 24. The equalization signal by the equalizer 21 is input to the wide PLL 22.

During the above operation, when an optical pick-up (not shown) reaches the vicinity of a desired target position, that is, an optical pick-up is located in a wide PLL range of which a normal operation can be executed, the wide PLL 22 performs a normal phase lock operation using the voltage of the phase lock control signal supplied from the automatic adjuster 23 and the equalized signal output from the equalizer 21. As a result, an oscillating frequency is sequentially varied by the wide PLL 22, and the voltage Vq output from the corrector 24 is also linearly decreased as shown in FIG. 4, or increased. The equalizer 21 equalizes the radio frequency signal read from the optical disc based on the voltage Vq of the equalization control signal input from the corrector 24, so that the frequency characteristic of the radio frequency signal is optimized. Therefore, before the pick-up reaches the target position, the FIG. 2 apparatus can control the equalizer 21 to have the optimized signal equalization characteristic with regard to a desired target position, a type of an optical disc and reproduction velocity.

Figure 6:
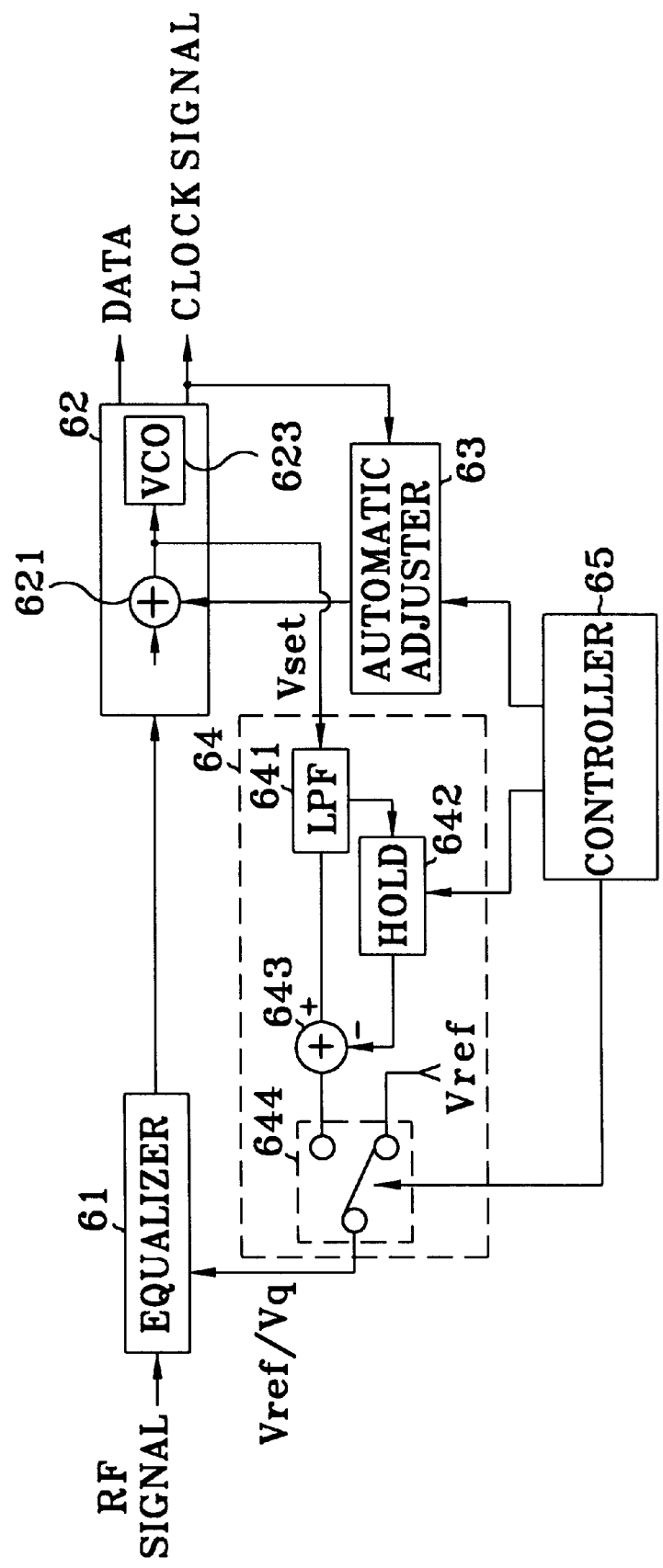
FIG. 6 is a detailed block diagram illustrating a signal reproduction unit in an optical disc system according to a second embodiment of the invention.

FIG. 6 shows part of a signal reproduction unit in an optical disc reproduction apparatus according to a second embodiment of the present invention. The optical disc reproduction apparatus including the signal reproduction unit shown in FIG. 6, unlike the FIG. 2 apparatus, generates an equalization control signal to be supplied to the equalizer 61 by using a voltage Vset for adjusting an oscillating frequency of a wide capture range phase locked loop 62. The wide PLL 62 comprises a phase difference detector 621 which generates a phase difference signal Vset having a voltage representing a phase difference between the signal output from the equalizer 61 and a phase lock control signal supplied from an automatic adjuster 63, and a voltage controlled oscillator 623 which oscillates with a voltage of the phase difference signal output from the phase detector 621. A corrector 64 comprises a low pass filter 641 for receiving the phase difference signal Vset generated by the phase difference detector 621, and a hold unit 642 for holding the voltage of the signal output from the low pass filter 641. A subtracter 643 subtracts the voltage maintained in the hold unit 642 from the signal output from the low pass filter 641, and supplies the subtraction result to a switch 644. The switch 644 selects one of a predetermined equalization control value Vref and the signal supplied from the subtracter 643 according to a control signal supplied from a controller 65, and outputs the selected one as an equalization control signal, to the equalizer 61. The controller 65 generates a control signal in accordance with whether the FIG. 6 apparatus performs an initial operation and a reset operation, or whether an optical pick-up (not shown) is moved to a desired target position.

In the case when an initial operation or a reset operation of the apparatus shown in FIG. 6 is performed, that is, when a type of an optical disc to be used and reproduction velocity is determined, the switch 644 in the corrector 64 selects the predetermined equalization control value Vref. At that time, the equalization control signal having the equalization control value Vref is input to the equalizer 61. The equalizer 61 equalizes the signal read from the optical disc (not shown) according to a signal equalization characteristic determined by the equalization control value Vref, and outputs the equalized signal to the wide PLL 62. The automatic adjuster 63, responsive to the control signal generated by the controller 65, selects a phase lock control value Vset0 determined by the type of a disc to be used and reproduction velocity among predetermined phase lock control values, and supplies the phase lock control signal having the selected phase lock control value Vset0 to the voltage-controlled oscillator 623 via the phase difference detector 621. The voltage-controlled oscillator 623 initially oscillates with a voltage of the supplied phase lock control signal and generates the clock signal. The phase difference signal which is output from the phase difference detector 621 and has the phase difference value Vset, is supplied to the low pass filter 641 in the corrector 64. The hold unit 642 holds a value Vset of the phase difference signal output from the low pass filter 641 according to the control signal of the controller 65, and continuously maintains the same value until the type of the disc and reproduction velocity are changed.

Next, when a pick-up position is to be accessed, that is, a desired target position to read the data from the optical disc, is determined, the controller 65 generates proper control signals. The switch 644 of the corrector 64, which is responsive to the control signal at this time, is switched to supply the signal applied from the subtracter 643 to the equalizer 61. The phase difference detector 621 produces a phase difference signal Vset having a voltage representing the phase difference between the phase lock control signal and the equalized signal, based on a difference between the voltage Vset0 of the phase lock control signal supplied from the automatic adjuster 63 and a voltage of the equalized signal output from the equalizer 61. The voltage-controlled oscillator 623 oscillates with the voltage of the phase difference signal Vset generated in the phase difference detector 621 and generates the clock signal. The automatic adjuster 63 receiving the clock signal generated by the voltage-controlled oscillator 623, updates the voltage of the phase lock control signal based on the clock signal so that a voltage being suitable for the desired target position is supplied to the phase difference detector 621. That is, the automatic adjuster 63 updates the voltage of the phase lock control signal so that the voltage corresponding to a frequency of the clock signal is identical to the voltage Vset0 for initially oscillating the voltage-controlled oscillator 623. The phase lock control signal having the updated voltage is supplied to the phase difference detector 621.

Meanwhile, the low pass filter 641 of the corrector 64, which receives the phase difference signal Vset output from the phase difference detector 621, low-pass-filters the received low-pass-filtered signal. The low-pass-filtered signal in the low pass filter 641 is supplied to the hold unit 642 and the subtracter 643. The subtracter 643 subtracts the voltage continuously held by the hold unit 642 from the output signal of the low pass filter 641 and outputs the subtraction result to the switch 644. The switch 644 outputs a voltage of the signal supplied from the subtracter 643 as an equalization control signal to the equalizer 61.

Figure 7:
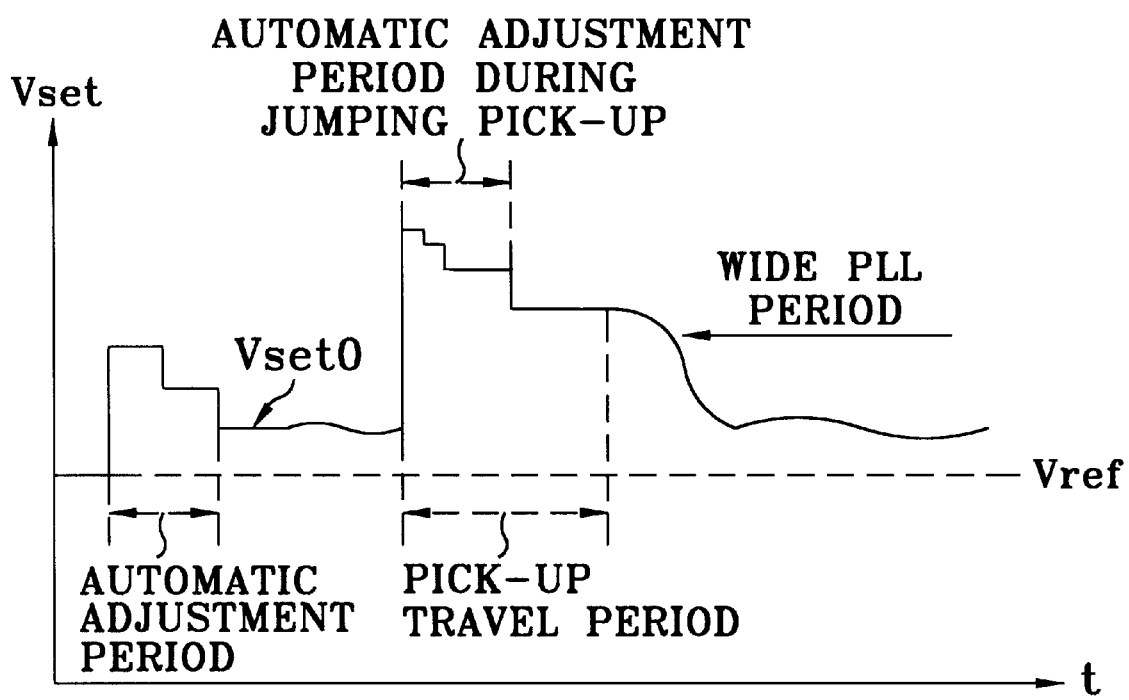
FIG. 7 is a waveform view showing an input from the corrector shown in FIG. 6.

When an optical pick-up reaches the vicinity of a desired target position, that is, an optical pick-up located in a wide PLL range of which a normal operation can be executed, a frequency of the clock signal output from the voltage controlled oscillator 623 is continuously varied. Therefore, the voltage of the phase lock control signal output from the automatic adjuster 63 is also continuously varied. As a result, the voltage of the phase difference signal supplied to the corrector 64 reaches a constant voltage Vset0, as shown in FIG. 7.

As described above, an optical disc reproduction apparatus according to the present invention corrects the characteristic of the equalizer according to a type of an optical disc to be used, reproduction velocity and a desired target position. Accordingly, in the case of reproducing a compact disc (CD), a digital video disc (DVD), etc., at various reproduction velocities, using a constant linear velocity method and a wide-capture range phase-locked loop, the present invention provides an effect of optimizing the characteristic of the equalizer.

While only certain embodiments of the invention have been specifically described herein, it will be apparent that numerous modifications may be made thereto without departing from the spirit and scope of the invention.

Although a few preferred embodiments of the present invention have been shown and described, it would be appreciated by those skilled in the art that changes may be made in this embodiment without departing from the principles and spirit of the invention, the scope of which is defined in the claims and their equivalents.

What is claimed is:

1. An optical disc reproduction apparatus for reproducing data from an optical disc using a constant linear velocity method, the optical disc reproduction apparatus comprising:

an equalizer to receive a signal read from the optical disc, and equalizing the received signal according to an equalization control signal;

a wide-capture range phase-locked loop (wide PLL) to receive the equalized signal, and to perform a phase lock operation with regard to the received equalized signal based on a phase lock control signal;

an automatic adjuster to select one of predetermined phase lock control values, according to a type of the optical disc to be read and a reproduction velocity determined during initial operation, and a desired target position to read the data from the optical disc, and to generate the phase lock control signal having the selected phase lock control value; and a correction unit to select one of a predetermined first equalization control value and a second equalization control value which is generated by said wide PLL and relating to the phase lock operation, according to the desired target position, and to generate the equalization control signal having the selected equalization control value.

2. The optical disc reproduction apparatus according to claim 1, wherein said wide PLL performs the phase lock operation with regard the received equalized signal, using the supplied phase lock control signal and the equalized signal received from said equalizer, until a new phase lock control signal is input thereto when the phase lock control signal is input from the automatic adjuster, and said correction unit selects the first equalization control value during initial operation, and selects the second equalization control value supplied from said wide PLL when the desired target position is determined.

3. The optical disc reproduction apparatus according to claim 2, wherein:

said wide PLL generates a clock signal as the result of a phase lock operation; and said correction unit generates the equalization control signal using the clock signal generated by said wide PLL when the desired target position is determined.

4. The optical disc reproduction apparatus according to claim 3, wherein said correction unit comprises:

a frequency-voltage converter to receive the clock signal generated by the wide PLL, and converting a frequency of the received clock signal to a voltage signal in the form of a voltage;

a low pass filter for receiving and low-pass-filtering the voltage signal; and a switch for selecting one of the signal low-pass-filtered by said low pass filter as said second equalization control value and said first equalization control value, and supplying the selected signal as the equalization control signal to said equalizer.

5. The optical disc reproduction apparatus according to claim 1, wherein:

said wide PLL performs the phase lock operation with regard to the equalized signal, using the equalized signal from said equalizer and the phase lock control signal from said automatic adjuster, to generate a clock signal, and said automatic adjuster updates the phase lock control signal using the clock signal generated by said wide PLL and supplies the updated phase lock control signal to said wide PLL.

6. The optical disc reproduction apparatus according to claim 5, wherein said wide PLL comprises:

a phase difference detector to generate a phase difference signal representing a phase difference between the equalized signal output from said equalizer and the phase lock control signal output from said automatic adjuster; and a voltage controlled oscillator to voltage control oscillate the phase difference signal generated by said phase difference detector, to output the clock signal.

7. The optical disc reproduction apparatus according to claim 6, wherein said correction unit comprises:

a low pass filter to receive the phase difference signal generated by said phase difference detector, and low-pass-filtering the received phase difference signal;

a hold unit to continuously hold the first low-pass-filtered signal by said low pass filter during an initialization operation;

a subtracter to subtract the first low-pass-filtered signal held by said hold unit from the signal low-pass-filtered by said low pass filter, with respect to the desired target position, to output a subtraction result signal; and a switch for selecting one of the predetermined first equalization control value and the subtraction result signal output from said subtracter, to output the equalization control signal having the selected one of the predetermined first equalization control value and the subtraction result signal.

8. An optical disc reproduction apparatus for reproducing data from an optical disc comprising:

an equalizer to receive a data signal indicative of the data read from the optical disc, and to equalize the data signal according to one of a plurality of characteristics of the equalizer;

a phase-locked loop (PLL) to perform a phase lock operation on the equalized data signal; and a correction unit to select the one of the plurality of characteristics of the equalizer based upon a type of the optical disc, a reproduction velocity of the optical disc and a desired target position on the optical disc of the data to be read therefrom.

9. An optical disc reproduction apparatus as claimed in claim 8, wherein the reproduction velocity of the optical disc is determined during an initial operation of the optical disc reproduction apparatus.

10. An optical disc reproduction apparatus as claimed in claim 8, wherein said correction unit comprises:

an automatic adjuster to select one of a plurality of predetermined phase lock control values according to the type of the optical disc, the reproduction velocity of the optical disc and the desired target position on the optical disc of the data to be read therefrom, to generate a phase lock control signal;

said PLL generating a clock signal based upon the equalized data signal and the phase lock control signal; and a corrector to select one of a predetermined first equalization control value and a second equalization control value determined based upon the clock signal, according to the desired target position, to generate an equalization control signal having the selected equalization control value;

wherein said equalizer equalizes the data signal according to the one of the plurality of characteristics determined by the equalization control signal.

11. An optical disc reproduction apparatus as claimed in claim 10, further comprising:

a controller to generate a first control signal based upon the type of the optical disc, the reproduction velocity of the optical disc and the desired target position on the optical disc of the data to be read therefrom, and a second control signal based upon the desired target position;

wherein said automatic adjuster selects the one of the plurality of predetermined phase lock control signals based upon the first control signal, and said corrector selects the one of the predetermined first equalization control value and the second equalization control value based upon the second control signal.

12. An optical disc reproduction apparatus as claimed in claim 10, wherein said corrector comprises:
   a frequency voltage converter to convert a frequency of the clock signal to a voltage signal; and
   a switch to select one of the voltage signal and the first equalization control value, to generate the equalization control signal.

13. An optical disc reproduction apparatus as claimed in claim 12, wherein said corrector further comprises a low pass filter to low pass filter the voltage signal, said switch selected one of the low pass filtered voltage signal as the second equalization control value and the first equalization control value.

14. An optical disc reproduction apparatus as claimed in claim 13, wherein said switch selects the equalization control signal having the first equalization control value during an initial operation of the optical reproduction apparatus and selects equalization control signal having the low pass filtered voltage value when the desired target position is determined.

15. An optical disc reproduction apparatus as claimed in claim 13, wherein a band of said low pass filter is 20–30 Hz.

16. An optical disc reproduction apparatus as claimed in claim 10, wherein said corrector selects the equalization control signal having the first equalization control value during an initial operation of the optical reproduction apparatus and selects the equalization control signal having the second equalization control value when the desired target position is determined.

17. An optical disc reproduction apparatus as claimed in claim 10, wherein said automatic adjuster supplies the phase lock control signal to said PLL so that an oscillating frequency of the phase lock control signal is the same as an estimated frequency which is appropriate for the type of the optical disc, the reproduction velocity of the optical disc and the desired target position on the optical disc of the data to be read therefrom.

18. An optical disc reproduction apparatus as claimed in claim 14, wherein said switch selects the equalization control signal having the low pass filtered voltage signal when an optical pickup reaches a vicinity of the desired target position.

19. An optical disc reproduction apparatus as claimed in claim 14, wherein the equalization control signal having the low pass filtered voltage value is linearly increased or decreased, based upon the clock signal.

20. An optical disc reproduction apparatus as claimed in claim 8, wherein:
   said PLL generates a clock signal based upon the equalized data signal and a phase lock control signal;
   an automatic adjuster to select one of a plurality of predetermined phase lock control values according to the type of the optical disc, the reproduction velocity of the optical disc, the desired target position on the optical disc of the data to be read therefrom and the clock signal, to generate the phase lock control signal; and
   said correction unit selects one of a predetermined first equalization control value and a second equalization control value determined, based upon a phase difference signal which is used to adjust an oscillating frequency of said PLL.

21. An optical disc reproduction apparatus as claimed in claim 8, wherein said correction unit comprises:

an automatic adjuster to select one of a plurality of predetermined phase lock control values according to the type of the optical disc, the reproduction velocity of the optical disc, the desired target position on the optical disc of the data to be read therefrom and a clock signal, to generate a phase lock control signal;
said PLL including
   a phase difference detector to determine a phase difference between the equalized data signal and the phase lock control signal, to generate a phase difference signal, and
   a voltage controlled oscillator to generate the clock signal and phase-locked data, based upon the phase difference signal and the phase lock control signal; and
   a corrector to select one of a predetermined first equalization control value and a second equalization control value determined based upon the phase difference signal, according to the desired target position, to generate an equalization control signal having the selected equalization control value;
wherein said equalizer equalizes the data signal according to the one of the plurality of characteristics determined by the equalization control signal.

22. An optical disc reproduction apparatus as claimed in claim 21, wherein said corrector comprises:
   a low pass filter to low pass filter the phase difference signal;
   a hold unit to hold a voltage of the low pass filtered phase difference signal;
   a subtracter to subtract the voltage held by said hold unit from the low pass filtered difference signal, to generate the second equalization control value; and
   a switch to select one of the second equalization control value and the first equalization control value, to generate the equalization control signal.

23. An optical disc reproduction apparatus as claimed in claim 22, wherein said switch selects the equalization control signal having the first equalization control value when the optical disc reproduction apparatus performs an initial or reset operation, and selects the equalization control signal having the second equalization control value when the desired target position is determined.

24. An optical disc reproduction apparatus as claimed in claim 22, wherein said switch selects the equalization control signal having the first equalization control value when the type of the optical disc or the reproduction velocity is determined, and selects the equalization control signal having the second equalization control value when the desired target position is determined.

25. An optical disc reproduction apparatus as claimed in claim 22, wherein said hold unit hold the voltage of the low pass filtered phase difference signal until the type of the disc and the reproduction velocity are changed.

26. An optical disc reproduction apparatus as claimed in claim 21, wherein said automatic adjuster updates the phase lock control value so that a voltage corresponding to a frequency of the clock signal is identical to a voltage of the phase lock control value for initially oscillating said voltage controlled oscillator.

27. An optical disc reproduction apparatus as claimed in claim 21, wherein said voltage controlled oscillator continuously changes a frequency of the clock signal when an optical pickup reaches a vicinity of the desired target position, thereby continuously changing a voltage of the phase lock control signal output from said automatic adjuster, so that the phase difference signal has a constant voltage.

28. A method of reproducing data from an optical disc, comprising the steps of:

selecting one of a plurality of characteristics to equalize a data signal indicative of the data read from the optical disc;

performing a phase lock operation on the equalized data;

generating a clock signal from the phase locked equalized data signal; and selecting one of a plurality of predetermined phase lock control values according to a type of the optical disc, a reproduction velocity of the optical disc, and a desired target position on the optical disc of the data to be read therefrom, to generate a phase lock control signal;

wherein said step of performing a phase lock operation is based upon the phase lock control signal, and said step of selecting one of a plurality of characteristics comprises the steps of:

selecting the one of a plurality of characteristics based upon a first predetermined equalization control value during an initial operation; and selecting the one of a plurality of characteristics based upon a second equalization control value derived from the clock signal when the desired target position is determined.

29. A method as claimed in claim 28, wherein said step of selecting the one of a plurality of characteristics based upon the second equalization control value comprises the steps of:

converting a frequency of the clock signal to a voltage signal;

low pass filtering the voltage signal; and outputting the low pass filtered voltage signal as the second equalization control value.

30. A method of reproducing data from an optical disc, comprising the steps of:

selecting one of a plurality of characteristics to equalize a data signal indicative of the data read from the optical disc;

performing a phase lock operation on the equalized data;

determining a phase lock control signal based upon a type of the optical disc, a reproduction velocity of the optical disc, and a desired target position on the optical disc of the data to be read therefrom, and based upon a clock signal, to generate a phase lock control signal, to generate a phase lock signal;

determining a phase difference between the equalized data signal and the phase lock control signal, to generate a phase difference signal;

determining a phase difference between the equalized data signal and the phase lock control signal, to generate a phase difference signal;

generating the clock signal based upon the phase difference signal; and determining a second equalization control value based upon the phase difference signal.

31. A method as claimed in claim 30, wherein said step of determining the second equalization control value comprises the steps of:

low pass filtering the phase difference signal;

holding the low pass filtered phase difference signal;

subtracting the held low pass filtered phase difference signal from the low pass filtered phase difference signal, to generate the second equalization control value.

32. A method of reproducing data from an optical disc, comprising the steps of:

selecting one of a plurality of characteristics to equalize a data signal indicative of the data read from the optical disc based upon a reproduction velocity of the optical disc; and performing a phase lock operation on the equalized data;

wherein said step of selecting one of a plurality of characteristics comprises the steps of:

selecting the one of a plurality of characteristics based upon a first predetermined equalization control value during an initial operation, and selecting the one of a plurality of characteristics based upon a second equalization control value when the desired target position is determined.

33. A method as claimed in claim 31, wherein said step of selecting one of a plurality of characteristics comprises the steps of:

selecting the one of a plurality of characteristics based upon a first predetermined equalization control value during an initial operation; and selecting the one of a plurality of characteristics based upon the second equalization control value when the desired target position is determined.

34. A method as claimed in claim 31, wherein said step of holding the low pass filtered phase difference signal comprises the steps of:

continuously holding the low pass filtered phase difference signal until the type of the optical disc and the reproduction velocity of the optical disc are changed.

* * * * *